United States Patent
Kawabata et al.

(10) Patent No.: US 6,760,093 B2
(45) Date of Patent: *Jul. 6, 2004

(54) IMAGE FORMING METHOD AND IMAGE FORMING APPARATUS

(75) Inventors: Kouya Kawabata, Shizuoka (JP); Mitsuru Sawano, Shizuoka (JP)

(73) Assignee: Fuji Photo Film Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 298 days.

(21) Appl. No.: 09/226,128

(22) Filed: Jan. 7, 1999

(65) Prior Publication Data

US 2002/0001069 A1 Jan. 3, 2002

(30) Foreign Application Priority Data

Jan. 7, 1998 (JP) .......................................... 10-001725

(51) Int. Cl.⁷ ............................. G03B 27/32; B41J 2/01
(52) U.S. Cl. ....................................... 355/27; 347/103
(58) Field of Search ........................... 355/27; 347/103, 347/88, 176; 430/201, 200

(56) References Cited

U.S. PATENT DOCUMENTS 5,614,933 A * 3/1997 Hindman et al. ........... 347/103
5,856,060 A * 1/1999 Kawamura et al. ......... 430/201

FOREIGN PATENT DOCUMENTS

| EP | 0 414 362 A2 | 2/1991 |
| EP | 0 649 753 A1 | 4/1995 |
| GB | 869 076 A | 5/1961 |
| GB | 2 259 888 A | 3/1993 |
| WO | WO 97 42040 A | 11/1997 |

\* cited by examiner

Primary Examiner—Peter B. Kim
(74) Attorney, Agent, or Firm—Sughrue Mion, PLLC

(57) ABSTRACT

A liquid droplet containing thermosetting or ultraviolet curing adhesive material is jetted out to either of a transfer member (5) or an image receiving member (11) so as to correspond to a shape of an image so that a latent image is formed. The transfer member (5) and the image receiving member (11) are brought into close contact with each other so that the latent image is interposed between the transfer member (5) and the image receiving member (11). Then, heat or ultraviolet rays are applied for curing the adhesive material so that a transfer material formed on the transfer member (5) is fixed to the image receiving member (11) through the cured adhesive material. Then, the transfer member (5) and the image receiving member (11) are separated from each other so that only the fixed transfer material is transferred to the image receiving member (11). As a result, a required image is formed.

13 Claims, 6 Drawing Sheets

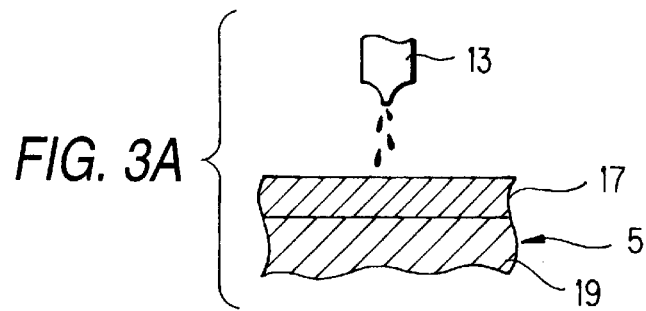
FIG. 3A
FIG. 3B
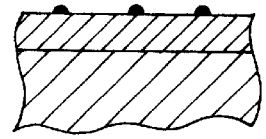
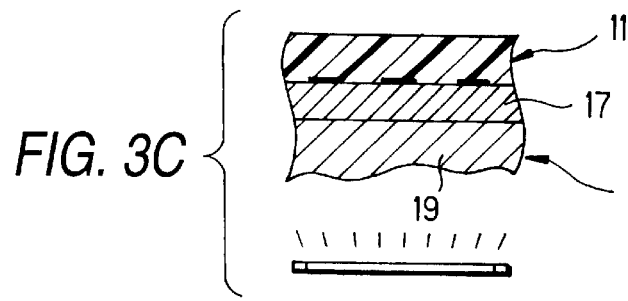
FIG. 3C
FIG. 3D
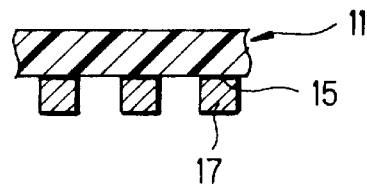

IMAGE FORMING METHOD AND IMAGE FORMING APPARATUS

BACKGROUND OF THE INVENTION

1. Field of the Invention

The present invention relates to an image forming method for forming an image by transferring a transfer material such as toner formed on a support member of a transfer member such as a toner sheet to an image receiving member such as an image receiving sheet, and relates to an image forming apparatus.

The present application is based on Japanese Patent Application No. Hei. 10-1725, which is incorporated herein by reference.

2. Description of the Related Art

One of the methods of forming an image on a transfer member, such as paper, is a stripping transfer method. The stripping transfer method uses a transfer member such as a toner sheet which incorporates a support member having a surface on which a transfer layer made of a transfer material such as pigment type toner is formed. The transfer member is superimposed on an image receiving member such as an image receiving sheet which is paper or the like. A thermal head applies heat through a rear side of the support member of the toner sheet to an area corresponding to the shape of a required image. Thus, toner is transferred to the image receiving sheet so that the image is formed on the image receiving sheet. The stripping transfer method may further include a step of sublimating toner to transfer the toner to the image receiving sheet, a step of melting hot-melt toner to cause molten toner to adhere to the image receiving sheet, or a step of causing an image receiving layer of the image receiving sheet to have adhesiveness with heat so that the toner of the toner sheet is fixed.

Further, there is an ink jet recording method in which an ink droplet is jetted out by mechanical energy so as to form an image without thermal recording. The ink jet recording method uses an ink jet recording head which comprises a plurality of nozzle openings arranged in parallel; pressure generating chambers respectively communicating with the nozzle openings and each having walls, a portion of each of which serves as a vibration plate; piezoelectric elements respectively attached onto surfaces of the vibration plates; and a common ink cavity for supplying ink to the pressure generating chambers. Pulse voltage corresponding to image information is applied to the piezoelectric element so that the vibration plate is mechanically deflected. Accordingly, the capacity of the pressure generating chamber is increased or decreased in accordance with the deflection of the vibration plate. By using the instantaneously changed pressure, ink droplets are respectively jetted out from the nozzle openings so that an image is formed on the image receiving sheet.

However, irregular heat conduction among the thermal head, the toner sheet and the image receiving sheet causes the distribution of temperatures to easily vary. As a result, there is a possibility in that images are formed nonuniformly. The stripping transfer method is performed such that a transfer layer which must be sublimated or melted is formed on the toner sheet. As an alternative to this, the image receiving layer arranged to have adhesiveness when heated is formed on the image receiving sheet. Therefore, a range of material separation is narrowed. As a result, the handling characteristic (the sliding characteristic) of the sheet members is limited. Therefore, there is a possibility in that freedom in designing a conveyance passage or the like is limited.

In the ink jet recording method, there is a possibility in that the employed pigment causes light resistance to deteriorate and unsatisfactory preservability to be permitted. Since the ink jet recording head jets out ink droplets directly to the image receiving sheet, bleed may be caused due to the penetration of the ink.

SUMMARY OF THE INVENTION

In view of the foregoing, an object of the present invention is to provide an image forming method and an image forming apparatus which are capable of overcoming non-uniform images caused from irregular heat conduction which is the problem of the stripping transfer method and unsatisfactory light resistance and bleed which are problems of the ink jet recording method.

To achieve the above-mentioned object, according to the present invention, there is provided an image forming method which comprises the steps of: providing a transfer member including a transfer material, and an image receiving member; forming a latent image on one of the transfer material and the image receiving member in liquid containing one of a thermosetting adhesive material and an ultraviolet curing adhesive material; bringing the transfer member and the image receiving member into close contact with each other so that the latent image is sandwiched between the transfer material and the image receiving member; applying one of heat and ultraviolet rays to cure the adhesive material so that the transfer material is fixed to the image receiving member through the cured adhesive material; and separating the transfer member and the image receiving member from each other. It is preferable that the image forming method further comprises a step of providing a droplet jetting head, wherein the droplet jetting head jets out liquid droplets to form the latent image on one of the transfer material and the image receiving member. In the image forming method according to the present invention, the transfer member and the image receiving member are separated from each other so that only the portion in which the adhesive material is allowed to adhere is separated from the support member. As a result, the transfer material is transferred to the image receiving member to correspond to the shape of the image so that the image is formed on the image receiving member.

An image forming apparatus according to the present invention comprises: a transfer member including a support member and a transfer material formed on the support member; a droplet jetting head jetting out liquid droplets containing one of a thermosetting adhesive material and an ultraviolet curing adhesive material to form a latent image on an image forming surface of one of the transfer material and an image receiving member, wherein the transfer member and the image receiving member are brought into close contact with each other so that the latent image is interposed between the transfer material and the image receiving member; and an adhesive-material curing device applying heat or ultraviolet rays to the transfer member and the image receiving member so that the adhesive material is cured. Since the image forming apparatus according to the present invention comprises the droplet jetting head and the adhesive-member curing device, liquid droplets containing the thermosetting or ultraviolet curing adhesive material are jetted out to correspond to a shape of an image so as to form a latent image on the surface of one of the transfer material and an image receiving member. The latent image is cured by the adhesive-member curing device so that the transfer material of the transfer member is fixed to the image receiving member to correspond to the shape of the image.

The image forming apparatus according to the present invention may have a structure that a direction in which the liquid droplets are jetted out from the droplet jetting head can be changed to either of a direction toward the transfer member or a direction toward the image receiving member. Accordingly, a preferred image forming surface can be selected when the latent image is formed.

It is further preferable that the image forming apparatus comprises a support drum; and a pinch roller disposed opposite to the support drum in the same axial direction of the support drum. In this case, the transfer member and the image receiving member are inserted between the support drum and the pinch roller so as to be brought into close contact with each other. Moreover, it is further preferable that the pinch roller includes the adhesive-material curing device.

BRIEF DESCRIPTION OF THE DRAWINGS

FIGS. 3A to 3D show a process for forming an image according to a second embodiment of the present invention;

DETAILED DESCRIPTION OF THE PREFERRED EMBODIMENTS

Figure 1:
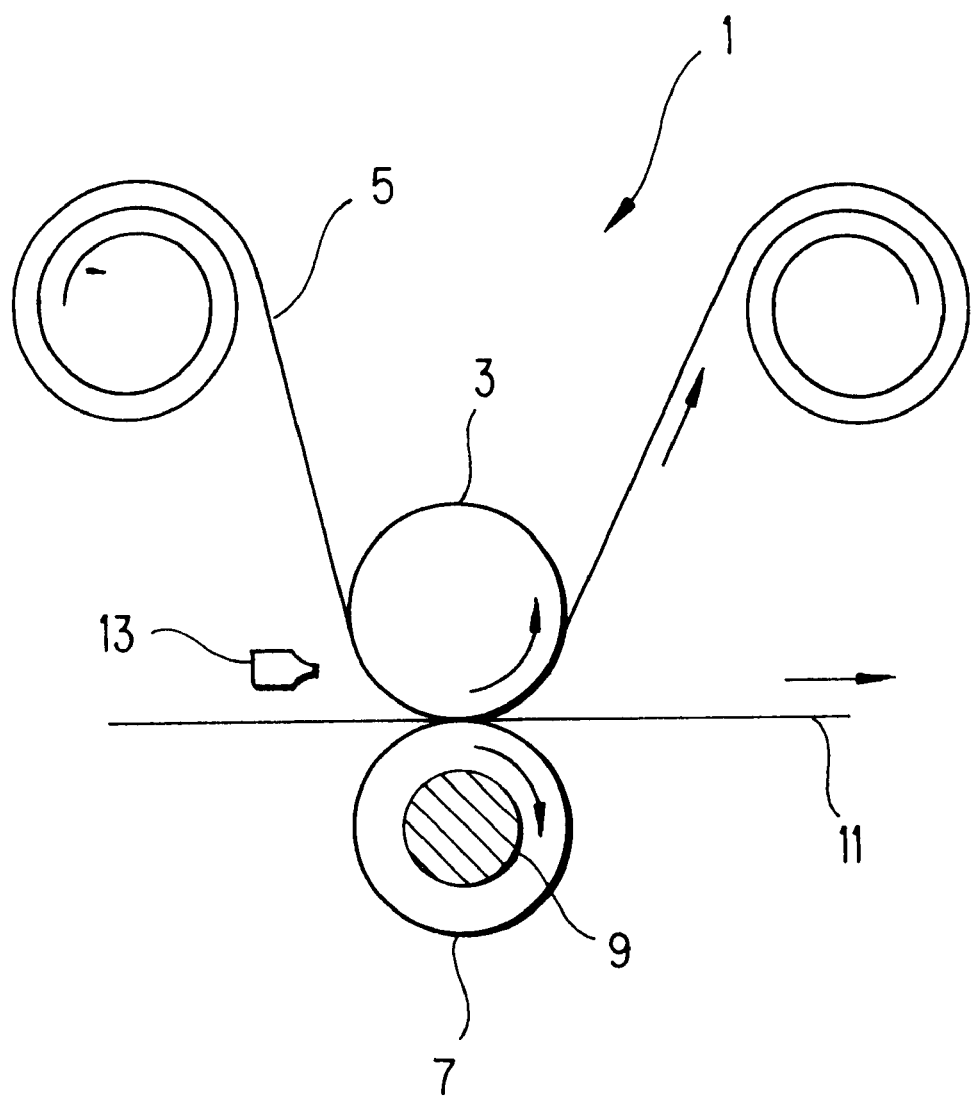
FIG. 1 is a schematic view showing the structure of an image forming apparatus according to the present invention.

A preferred embodiment of an image forming apparatus according to the present invention will now be described with reference to FIG. 1.

The image forming apparatus 1 includes a support drum 3. A transfer member 5 such as a toner sheet having a support member on which a transfer material is formed is wound around a portion of the support drum 3. A direction in which the support drum 3 is rotated is the main scanning direction for forming an image. The transfer material which is formed on the support member may be any one of pigment type toner, metal and resin having affinity with ink. In this embodiment, the transfer material is the pigment type toner.

The transfer member 5 is supported by the support drum 3 so that the support member of the transfer member 5 is brought into contact with the support drum 3 so that the transfer material of the transfer member 5 is made to be at an outside. The image forming apparatus 1 further includes a pinch roller 7 disposed opposite to the support drum 3 in the same axial direction of the support drum 3. The pinch roller 7 includes a heater 9 therein. The overall body of the pinch roller 7 serves as an adhesive-material curing device (a heating device).

An image receiving member such as an image receiving sheet 11 is inserted between the support drum 3 and the pinch roller 7. Therefore, the transfer member 5 and the image receiving member 11 inserted between the support drum 3 and the pinch roller 7 are brought into contact with each other and heated. In this state, the transfer member 5 and the image receiving member 11 are moved to the right-hand direction in FIG. 1 by rotations of the support drum 3 and the pinch roller 7.

The image receiving member 11 may be made of paper, epoxy glass resin or a pressing plate. In this embodiment, the image receiving member 11 is the image receiving sheet made of paper.

The image forming apparatus 1 further includes a droplet jetting head 13 at a position opposite to the support drum 3. The droplet jetting head 13 is movably supported through a movement permitting rail or the like (not shown) in a direction perpendicular to the surface of the drawing sheet on which FIG. 1 is drawn. The direction in which the droplet jetting head 13 is moved is the sub-scanning direction for forming an image. The droplet jetting head 13 jets out liquid droplets containing the adhesive material to correspond to the shape of the image so as to form a latent image on the surface of the transfer material of the transfer member 5 supported by the support drum 3. The droplet jetting head 13 may be similarly to the ink jet recording head discussed in the related art. However, the droplet jetting head 13 is not limited to the ink jet recording head, and may be a bubble jet recording head, a mach jet recording head or the like.

The adhesive material may be made of a thermosetting material or an ultraviolet curing material. In this embodiment, the adhesive material is made of the thermosetting material. The adhesive material is incorporated in an appropriate solvent such as a wax to thereby prepare an aqueous solution.

First Embodiment

A first embodiment of the present invention in which the above-mentioned image forming apparatus 1 is used will now be described with reference to FIGS. 2A to 2D. FIGS. 2A to 2D show a process for forming an image according to the first embodiment of the present invention.

Figure 2A:
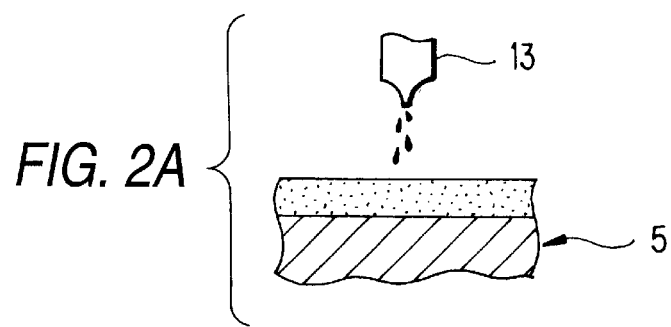
FIGS. 2A to 2D show a process for forming an image according to a first embodiment of the present invention.
Figure 2B:
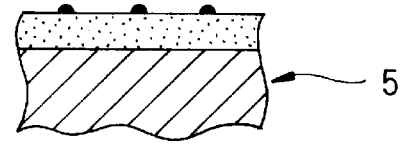

In this embodiment, a K (black) transfer member 5, a C (cyan) transfer member 5, a M (magenta) transfer member 5 and a Y (yellow) transfer member 5 are prepared beforehand. When a process for forming an image has been started, liquid droplets containing the adhesive material are jetted out from the droplet jetting head 13 to the K transfer member 5, as shown in FIG. 2A. Accordingly, a latent image is formed, as shown in FIG. 2B.

Figure 2C:
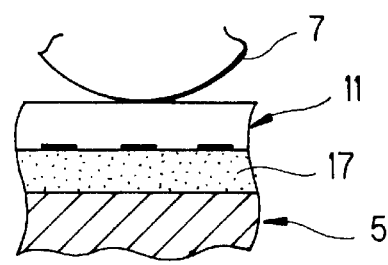

Then, the transfer member 5 on which the latent image has been formed is brought into close contact with the image receiving member 11 in such a manner that the latent image is interposed. Then, the transfer member 5 and the image receiving member 11 are pressed by the support drum 3 and the pinch roller 7. At this time, as shown in FIG. 2C, the pinch roller 7, which is adhesive-member curing device (a heating device), heats the overall surfaces of the image receiving member 11 and the transfer member 5, so that the adhesive material corresponding to the shape of the image is cured with the heat. As a result, the transfer material 17 of the transfer member 5 is fixed so as to correspond to the shape of the image.

Figure 2D:
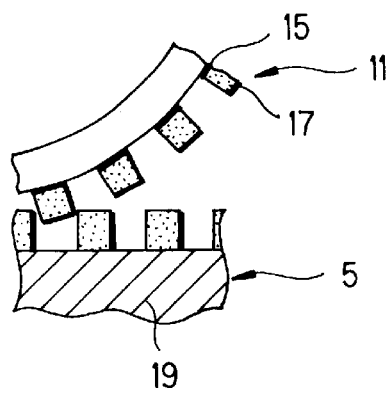

Then, the transfer member 5 is wound and conveyed along the support drum 3 in the circumferential direction so that the transfer member 5 is separated from the image receiving member 11 as shown in FIG. 2D. Since the transfer member 5 and the image receiving member 11 are separated from each other, the dot-shape transfer material 17 in only the portion to which the adhesive material 15 has adhered is separated from the support member 19. As a result, the image is formed on the image receiving member 11.

Then, a similar process is performed such that the C, M and Y transfer members 5 are used to sequentially transfer materials (toner) 17 in the foregoing colors on one image receiving member 11 in accordance with image information. As a result, a full color image in the form in which the four colors are superimposed is formed.

As described above, the image forming method using the above-mentioned image forming apparatus 1 is structured to heat the overall surfaces of the transfer member 5 and the image receiving member 11 brought into close contact with each other such that the adhesive material 15 is interposed. Thus, the transfer material 17 is fixed to the image receiving member 11 through the cured adhesive material 15. Therefore, irregularity in thermal conduction caused from irregular contact of the thermal head and nonuniform thickness of the support member 19 as experienced with the stripping transfer method can be prevented. Thus, a uniform image can be formed.

Since the pigment type toner is formed on the support member 19, the ink jet recording head is not required to jet out ink droplets as in the ink jet recording method. Therefore, selection of pigment type toner from various types is permitted. Thus, a transfer material 17 having excellent light resistance can be employed.

Furthermore, since ink is not directly deposited on the image receiving member 11, and the transfer material 17 previously and uniformly formed on the support member 19 is bonded and fixed to the image receiving member 11, the bleed of the ink does not occur.

Since the adhesive material 15 is sprayed to the transfer member 5, forming of an adhesive layer on each of the transfer member 5 and the image receiving member 11 can be eliminated. As a result, the handling characteristic of each of the transfer member 5 and the image receiving member 11 can be improved.

Second Embodiment

A second embodiment of the present invention will now be described with reference to FIGS. 3A to 3D. FIGS. 3A to 3D show a process for forming an image according to the second embodiment of the present invention.

In this embodiment, a transfer member 5 comprises a support member 19 and a metal layer (in the form of a thin film) formed on the support member 19 and serving as the transfer material 17. Further, an epoxy glass type resin plate is employed as an image receiving member 11. An adhesive material 15 is an ultraviolet ray curing material.

To form an image, as shown in FIGS. 3A and 3B, the droplet jetting head 13 is operated similarly to the first embodiment so that a latent image is formed on the surface of the transfer material 17 with dots formed by liquid droplets. Then, as shown in FIG. 3C, the image receiving member 11 which is the epoxy glass type resin plate is brought into close contact with the surface of the transfer material 17. Then, ultraviolet rays are applied so that the adhesive material 15 is cured to fix the transfer material 17 to the image receiving member 11.

Then, as shown in FIG. 3D, the image receiving member 11 and the transfer member 5 are separated from each other so that the transfer material 17 only in the portion to which the adhesive material 15 has adhered is separated from the support member 19. As a result, an image is formed on the image receiving member 11.

According to the above-mentioned image forming method, the metal layer can be separated from the support member 19 through the adhesive material 15 which is formed into a shape of the image. Therefore, a precise printed circuit board or the like can be easily formed. Accordingly, the number of the manufacturing processes can be decreased.

Third Embodiment

A third embodiment of the present invention will now be described with reference to FIGS. 4A to 4D. FIGS. 4A to 4D show a process for forming an image according to the third embodiment of the present invention.

In this embodiment, a transfer member 5 comprises a support member 19 and a lipophilic resin layer formed on the support member 19 and serving as the transfer material 17. An image receiving member 11 is a drum-shape pressing member having an outer surface which serves as a press plate surface. The adhesive material 15 is made of an ultraviolet ray curing material.

Figure 4A:
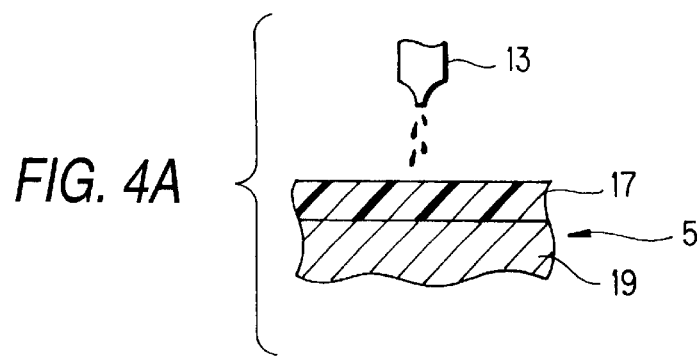
FIGS. 4A to 4D show a process for forming an image according to a third embodiment of the present invention.
Figure 4B:
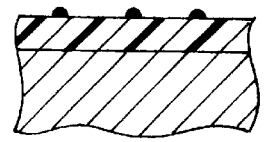
Figure 4C:
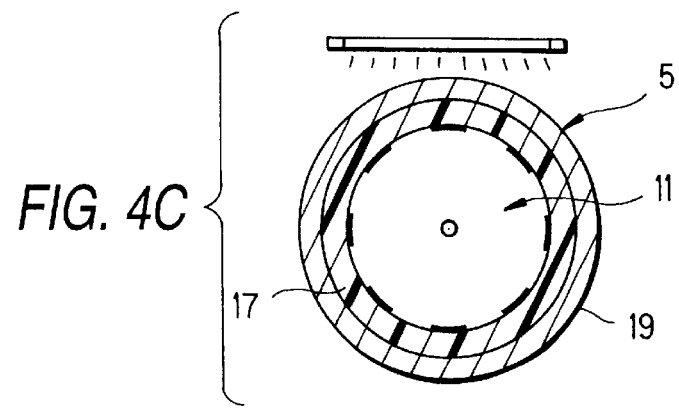

To form an image, as shown in FIGS. 4A and 4B, the droplet jetting head 13 is operated so that a latent image is formed on the surface of the transfer material 17 with dots formed by liquid droplets. Then, as shown in FIG. 4C, the transfer member 5 is wound around the transfer member 5 and brought into close contact with the surface of the drum in such a manner that the image forming surface of the transfer member 5 is brought into contact with the outer surface of the drum which is the image receiving member 11. Then, ultraviolet rays are applied so that the adhesive material 15 is cured.

Figure 4D:
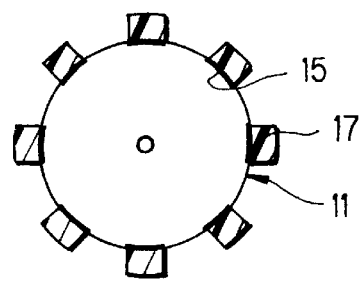

Then, as shown in FIG. 4D, the image receiving member 11 and the transfer member 5 are separated from each other so that the transfer material 17 in only the portion to which the adhesive material 15 has adhered is separated from the support member 19. As a result, an image is formed on the image receiving member 11. Therefore, the outer surface of the drum which is the image receiving member 11 has the image made of the lipophilic resin and formed as a plate.

The image forming method according to this embodiment enables a required and precise image to be formed even on a curved surface, such as the outer surface of the drum. Since the lipophilic resin layer is employed as the transfer material 17, a drum having a plate embedded therein can be formed in such a manner that the number of manufacturing processes is decreased.

Fourth Embodiment

Figure 5:
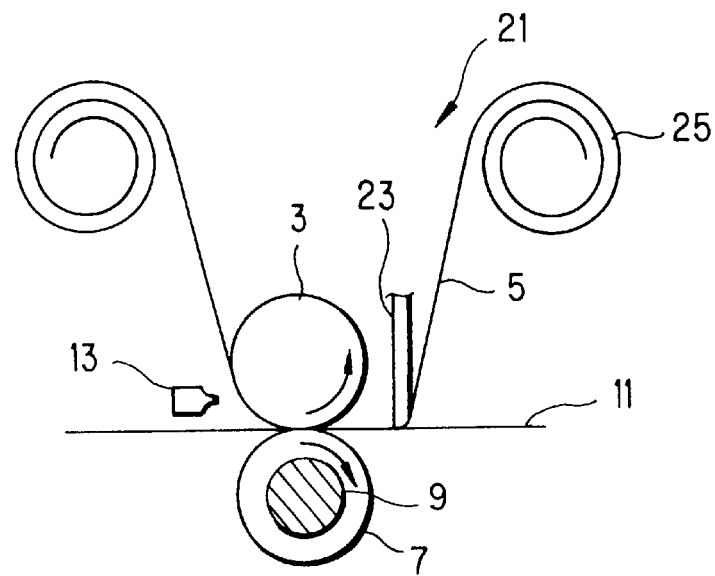
FIG. 5 is a schematic view showing an image forming apparatus according to a fourth embodiment of the present invention.

A fourth embodiment of the present invention will now be described with reference to FIG. 5. FIG. 5 is a schematic view showing an image forming apparatus according to the fourth embodiment of the present invention.

An image forming apparatus 21 comprises a peeling bar 23, for pressing the transfer member 5 against the image receiving member 11, located at downstream of the support drum 3 in the conveying direction. The transfer member 5 is wound under a predetermined tension between the peeling bar 23 and a device 25 for winding the transfer member 5. Moreover, the transfer member 5 allowed to pass through the peeling bar 23 is separated from the image receiving member 11 and extended in a direction substantially perpendicular to the image receiving member 11.

In the above-described image forming apparatus 21, the support member of the transfer member 5 is bent at the peeling bar 23 at an angle which is substantially a right angle. Therefore, the support member and the transfer material can be easily separated from each other because of the difference in the bend radius. As a result, the image receiving member 11 can satisfactorily be fixed to the transfer material.

Fifth Embodiment

Figure 6:
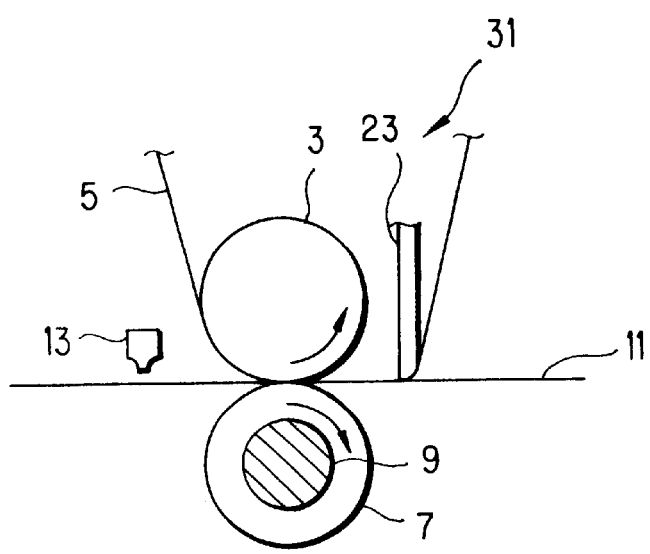
FIG. 6 is a schematic view showing an image forming apparatus according to a fifth embodiment of the present invention.

A fifth embodiment of the present invention will now be described with reference to FIG. 6. FIG. 6 is a schematic view showing an image forming apparatus according to the fifth embodiment of the present invention.

An image forming apparatus 31 according to this embodiment comprises a droplet jetting head 13 disposed so that liquid droplets are jetted out to the image receiving member 11. Therefore, a latent image formed by the liquid droplets is formed on the image receiving member 11.

The image receiving member 11 on which the latent image has been formed is brought into close contact with the transfer member 5 so as to be pressed and heated by the support drum 3 and the pinch roller 7. Thus, similar to the first embodiment, the transfer material of the transfer member 5 is fixed to the image receiving member 11 through the cured adhesive material. Since the transfer member 5 and the image receiving member 11 are separated from each other, an image is formed on the image receiving member 11.

In comparison with a structure that liquid droplets are adhered to the transfer member 5 having a transfer material layer formed thereon, the image forming apparatus 31 has the structure that liquid droplets are allowed to adhere to the image receiving member 11 made of paper or the like. Therefore, liquid droplets can be easily allowed to adhere. Moreover, the range of employment of solvents for the adhesive material can be widened.

Sixth Embodiment

Figure 7:
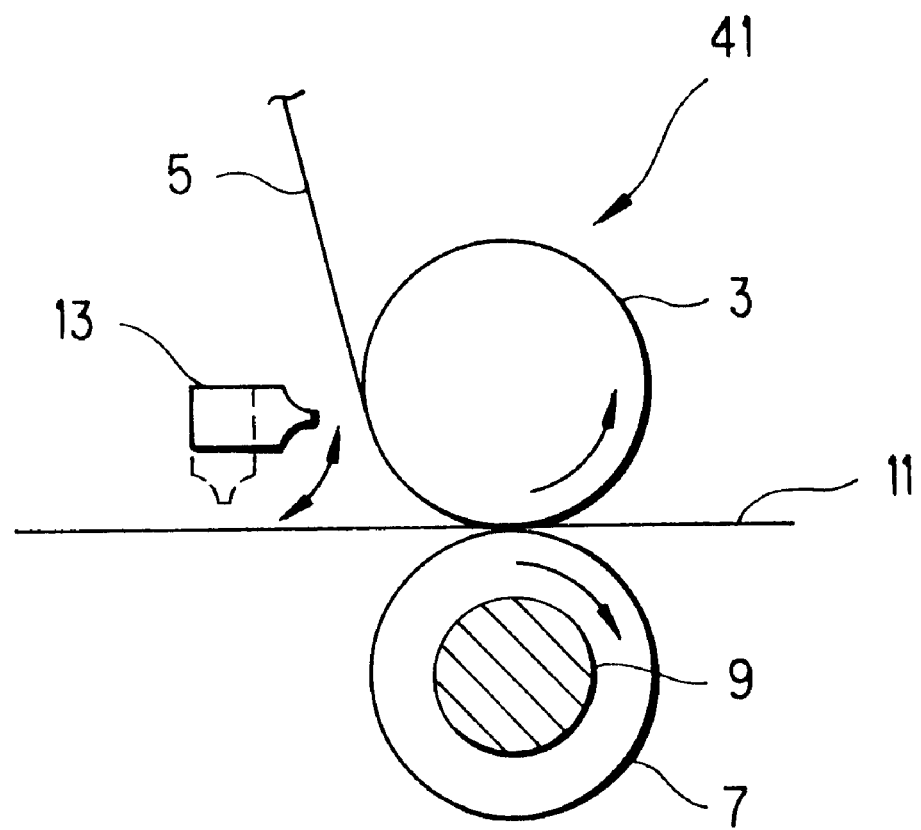
FIG. 7 is a schematic view showing an image forming apparatus according to a sixth embodiment of the present invention.

A sixth embodiment of the present invention will now be described. FIG. 7 is a schematic view showing an image forming apparatus according to the sixth embodiment of the present invention.

An image forming apparatus 41 according to this embodiment comprises a droplet jetting head 13 wherein a direction in which liquid droplets are jetted out from the droplet jetting head 13 can be changed between a direction toward the transfer member 5 and a direction toward the image receiving member 11.

A structure for switching the jetting out direction of the droplet jetting head 13 may be a structure that a droplet jetting head 13 having one nozzle opening is rotatively provided as shown in FIG. 7. Alternatively, the structure for switching the jetting out direction of the droplet jetting head 13 may be a structure that nozzle openings are previously formed in the required directions and are controlled to open or close.

The image forming apparatus 41 according to this embodiment is able to form a latent image by changing the droplet jetting out direction from the droplet jetting head 13 to a preferred image forming surface in accordance with the affinity between the employed transfer member 5 or the image receiving member 11 and the liquid droplet.

Seventh Embodiment

A seventh embodiment of the present invention will now be described.

An image forming apparatus according to this embodiment (not shown) has a structure similar to the first embodiment. This embodiment is different from the first embodiment in that a droplet jetting head which is capable of jetting out a liquid droplet in the form of a plane or a line is employed. Moreover, a mask having through holes corresponding to the shape of an image is disposed between the droplet jetting head and the transfer member or between the droplet jetting head and the image receiving member. To jet out a liquid droplet in the form of a plane, a structure may be employed which incorporates a plurality of nozzle openings or which incorporates a diffusion nozzle or which is formed such that nozzle openings formed in a line in the main scanning direction are moved in the sub-scanning direction.

The image forming apparatus according to this embodiment has the structure that a liquid droplet jetted out in the form of a plane from the droplet jetting head is sprayed through the mask. Therefore, the liquid droplet allowed to pass through the through holes formed in the mask enables a latent image having the same shape as that of the through hole to be formed on the transfer member or the image receiving member.

Since the image forming apparatus according to this embodiment jets out a liquid droplet in the form of a plane, an image can quickly be formed.

As described above, according to the present invention, a liquid droplet containing the adhesive material is jetted out so as to correspond to the shape of an image so that a latent image is formed on the transfer member. Then, the overall surfaces of the transfer member and the image receiving member are heated so that the transfer member is fixed to the image receiving member through the cured adhesive material. Therefore, the adverse influence of distribution of temperatures caused from irregularity of the thicknesses of the support member and irregular contact with the thermal head can be prevented. Therefore, a uniform image can be formed.

What is claimed is:

1. An image forming apparatus comprising:

a transfer member including a support member and a transfer material formed on the support member;

a droplet jetting head jetting out liquid droplets containing a thermosetting adhesive material to form a latent image on a surface of one of the transfer material and an image receiving member, wherein a direction in which the liquid droplets are jetted out from the droplet jetting head can be changed to either one of a direction toward the transfer member and a direction toward the image receiving member, and wherein the transfer member and the image receiving member are brought into close contact with each other and sandwiched together so that the latent image is interposed between the transfer material and the image receiving member; and an adhesive-material curing device which applies heat to the transfer member and the image receiving member so that the adhesive material is cured, wherein after curing the transfer member and the image receiving member are separated such that the latent image is fixed to the image receiving member.

2. An image forming apparatus, comprising:

a transfer member including a support member and a transfer material formed on the support member;

a droplet jetting head jetting out liquid droplets containing one of a thermosetting adhesive material and an ultraviolet curing adhesive material to form a latent image on a surface of one of the transfer material and an image receiving member, wherein the transfer member and the image receiving member are brought into close contact with each other so that the latent image is interposed between the transfer material and the image receiving member; and an adhesive-material curing device which applies heat or ultraviolet rays to the transfer member and the image receiving member so that the adhesive material is cured, wherein a direction in which the liquid droplets are jetted out from the droplet jetting head can be change to either one of a direction toward the transfer member and a direction toward the image receiving member.

3. An image forming method, comprising steps of:

providing an image receiving member, and a transfer member including a transfer material formed thereon;

forming a latent image on one of the transfer material and the image receiving member in liquid containing an ultraviolet curing adhesive material;

bringing the transfer member and the image receiving member into close contact with each other so that the latent image is sandwiched between the transfer material and the image receiving member;

applying ultraviolet rays to cure the adhesive material so that the transfer material is fixed to the image receiving member through the cured adhesive material; and after curing, separating the transfer member and the image receiving member from each other such that the latent image is fixed only to the image receiving member.

4. The image forming method of claim 3, further comprising a step of providing a droplet jetting head, wherein the droplet jetting head jets out liquid droplets to form the latent image on one of the transfer material and the image receiving member.

5. The image forming method of claim 3, wherein, in the separating steps, only the fixed transfer material formed thereon is transferred to the image receiving member to form an image.

6. An image forming apparatus, comprising:

a transfer member including a support member and a transfer material formed on the support member;

a droplet jetting head jetting out liquid droplets containing an ultraviolet curing adhesive material to form a latent image on a surface of one of the transfer material and an image receiving member, wherein the transfer member and the image receiving member are brought into close contact with each other and sandwiched together so that the latent image is interposed between the transfer material and the image receiving member; and an adhesive-material curing device which applies ultraviolet rays to the transfer member and the image receiving member so that the adhesive material is cured, wherein, after curing, the transfer member and the image receiving member are separated such that the latent image is fixed to the image receiving member.

7. The image forming apparatus of claim 6, wherein a direction in which the liquid droplets are jetted out from the droplet jetting head can be changed to either one of a direction toward the transfer member and a direction toward the image receiving member.

8. The image forming apparatus of claim 6, further comprising:

a support drum; and a pinch roller disposed opposite to the support drum in the same axial direction of the support drum.

9. The image forming apparatus of claim 8, wherein the transfer member and the image receiving member are inserted between the support drum and the pinch roller so as to be brought into close contact with each other.

10. An image forming method comprising steps of:

providing an image receiving member, and a transfer member including a transfer material formed thereon;

forming a latent image on one of the transfer material and the image receiving member in liquid containing a thermosetting adhesive material;

brining the transfer member and the image receiving member into close contact with each other so that the latent image is sandwiched between the transfer material and the image receiving member;

applying heat to cure the adhesive material so that the transfer material is fixed to the image receiving member through the cured adhesive material; and after curing, separating the transfer member and the image receiving member from each other such that the latent image is fixed only to the image receiving member wherein the step of separating occurs at a peeling bar.

11. An image forming method, comprising steps of:

providing an image receiving member, and a transfer member including a transfer material formed thereon;

forming a latent image on one of the transfer material and the image receiving member in liquid containing a thermosetting adhesive material;

bringing the transfer member and the image receiving member into close contact with each other so that the latent image is sandwiched between the transfer material and the image receiving member;

applying heat to cure the adhesive material so that the transfer material is fixed to the image receiving member through the cured adhesive material; and after curing, separating the transfer member and the image receiving member from each other such that the latent image is fixed only to the image receiving member wherein the transfer member and the image receiving member are separated at an angle that is substantially a right angle.

12. An image forming apparatus, comprising:

a transfer member including a support member and a transfer material formed on the support member;

a droplet jetting head jetting out liquid droplets containing a thermosetting adhesive material to form a latent image on a surface of one of the transfer material and an image receiving member;

wherein the transfer member and the image receiving member are brought into close contact with each other and sandwiched together so that the latent image is interposed between the transfer material and the image receiving member;

an adhesive material curing device which applies heat to the transfer member and the image receiving member so that the adhesive material is cured; and a peeling bar for separating the transfer member and the image receiving member after curing such that the latent image is fixed to the image receiving member.

13. An image forming apparatus, comprising:

a transfer member including a support member and a transfer material formed on the support member;

a droplet jetting head jetting out liquid droplets containing a thermosetting adhesive material to form a latent image on a surface of one of the transfer material and an image receiving member, wherein the transfer member and the image receiving member are brought into close contact with each other and sandwiched together at a first location so that the latent image is interposed between the transfer material and the image receiving member; and an adhesive-material curing device which applies heat to the transfer member and the image receiving member so that the adhesive material is cured, wherein after curing, the transfer member and the image receiving member are separated at a second location different than the first location such that the latent image is fixed to the image receiving member.

* * * * *